(12) United States Patent
Dumka

(10) Patent No.: US 11,145,547 B2
(45) Date of Patent: Oct. 12, 2021

(54) SEMICONDUCTOR CHIP SUITABLE FOR 2.5D AND 3D PACKAGING INTEGRATION AND METHODS OF FORMING THE SAME

(71) Applicant: Qorvo US, Inc., Greensboro, NC (US)

(72) Inventor: Deep C. Dumka, Richardson, TX (US)

(73) Assignee: Qorvo US, Inc., Greensboro, NC (US)

( * ) Notice: Subject to any disclaimer, the term of this patent is extended or adjusted under 35 U.S.C. 154(b) by 29 days.

(21) Appl. No.: 16/701,698

(22) Filed: Dec. 3, 2019

(65) Prior Publication Data

US 2021/0098340 A1 Apr. 1, 2021

Related U.S. Application Data

(60) Provisional application No. 62/908,664, filed on Oct. 1, 2019.

(51) Int. Cl.
*H01L 21/768* (2006.01)
*H01L 21/3065* (2006.01)
(Continued)

(52) U.S. Cl.
CPC ...... *H01L 21/76898* (2013.01); *H01L 21/304* (2013.01); *H01L 21/3065* (2013.01);
(Continued)

(58) Field of Classification Search
CPC . H01L 23/481; H01L 2/0649; H01L 25/0657; H01L 21/304; H01L 23/66;
(Continued)

(56) References Cited

U.S. PATENT DOCUMENTS

2008/0308920 A1* 12/2008 Wan .................... B81C 1/00285
257/685
2014/0264660 A1* 9/2014 Rothberg ............ B81C 1/00158
257/416

(Continued)

OTHER PUBLICATIONS

Li, Li, et al., "3D SiP with Organic Interposer for ASIC and Memory Integration," 2016 IEEE 66th Electronic Components and Technology Conference (ECTC), Las Vegas, NV, May 31-Jun. 3, 2016, pp. 1445-1450.

(Continued)

*Primary Examiner* — Mouloucoulaye Inoussa
(74) *Attorney, Agent, or Firm* — Withrow & Terranova, PLLC

(57) ABSTRACT

The present disclosure relates to a semiconductor chip that includes a substrate, a metal layer, and a number of component portions. Herein, the substrate has a substrate base and a number of protrusions protruding from a bottom surface of the substrate base. The substrate base and the protrusions are formed of a same material. Each of the protrusions has a same height. At least one via hole extends vertically through one protrusion and the substrate base. The metal layer selectively covers exposed surfaces at a backside of the substrate and fully covers inner surfaces of the at least one via hole. The component portions reside over a top surface of the substrate base, such that a certain one of the component portions is electrically coupled to a portion of the metal layer at the top of the at least one via hole.

24 Claims, 11 Drawing Sheets

(51) Int. Cl.
*H01L 21/304* (2006.01)
*H01L 23/48* (2006.01)
*H01L 23/66* (2006.01)
*H01L 25/065* (2006.01)
*H01L 29/06* (2006.01)

(52) U.S. Cl.
CPC ............ *H01L 23/481* (2013.01); *H01L 23/66* (2013.01); *H01L 25/0657* (2013.01); *H01L 29/0649* (2013.01); *H01L 2223/6683* (2013.01)

(58) Field of Classification Search
CPC ........... H01L 21/3065; H01L 21/76898; H01L 21/52; H01L 21/561; H01L 24/47; H01L 24/24; H01L 23/49827; H01L 25/18; H01L 23/5389; H01L 21/486; H01L 23/49811; H01L 24/82; H01L 23/5384; H01L 23/3128; H01L 23/49894; H01L 23/49816; H01L 21/568; H01L 24/83; H01L 24/32; H01L 23/49822; H05K 3/3436; H05K 3/4007; B81B 7/008; B81B 7/0074; B06B 1/0622; B06B 1/0292; B81C 1/00238; A61B 8/44
USPC ........... 257/415, 416, 685, E23.18, E29.323; 438/51
See application file for complete search history.

(56) References Cited

U.S. PATENT DOCUMENTS

| 2015/0353348 | A1* | 12/2015 | Vandemeer | B81C 1/00269 257/415 |
| 2018/0122735 | A1* | 5/2018 | Dumka | H01L 21/52 |
| 2018/0257927 | A1* | 9/2018 | Rothberg | B06B 1/0622 |
| 2020/0144179 | A1 | 5/2020 | Chen et al. | |

OTHER PUBLICATIONS

Ma, Mike, et al., "The Development and Technological Comparison of Various Die Stacking and Integration Options with TSV Si Interposer," 2016 IEEE 66th Electronic Components and Technology Conference (ECTC), Las Vegas, NV, May 31-Jun. 3, 2016, pp. 336-342.

Ma, Shenglin, et al., "Process Development of a New TGV Interposer for Wafer Level Package of Inertial MEMS Device," 2016 17th International Conference on Electronic Packaging Technology (ICEPT), Wuhan, China, Aug. 16-19, 2016, pp. 983-987.

Song, Jinwook, et al., "Active Silicon Interposer Design for Interposer-Level Wireless Power Transfer Technology for High-Density 2.5-D and 3-D ICs,": IEEE Transactions on Components, Packaging and Manufacturing Technology, vol. 6, issue 8, Aug. 2016, pp. 1148-1161.

Non-Final Office Action for U.S. Appl. No. 16/701,722, dated Jul. 20, 2021, 7 pages.

* cited by examiner

SEMICONDUCTOR CHIP SUITABLE FOR 2.5D AND 3D PACKAGING INTEGRATION AND METHODS OF FORMING THE SAME

RELATED APPLICATIONS

This application claims the benefit of provisional patent application Ser. No. 62/908,664, filed Oct. 1, 2019, the disclosure of which is hereby incorporated herein by reference in its entirety.

The present application is related to concurrently filed U.S. patent application Ser. No. 16/701,722, filed on Dec. 3, 2019, entitled "SEMICONDUCTOR CHIP SUITABLE FOR 2.5D AND 3D PACKAGING INTEGRATION AND METHODS OF FORMING THE SAME," the disclosure of which is hereby incorporated herein by reference in its entirety.

FIELD OF THE DISCLOSURE

The present disclosure relates to a semiconductor chip and a process for making the same, and more particularly to a semiconductor chip suitable for 2.5-dimensional (2.5D) and 3D packaging integration and a fabrication process of the semiconductor chip utilizing selective substrate removal.

BACKGROUND

The market for portable and mobile data access devices is growing rapidly, driving the demand for increased functional convergence. Integrated circuit (IC) packaging has evolved, such that multiple IC chips may be vertically stacked in so-called three-dimensional (3D) packages in order to save horizontal area over a substrate. An alternative packaging technique, referred to as a 2.5D package, may utilize a semiconductor interposer for coupling one or more IC chips to a substrate. Herein, the IC chips mounted on the semiconductor interposer may be of heterogeneous technologies. Connections among the various ICs are routed through conductive patterns in the semiconductor interposer.

Typically, metal pillar bumps with heights in the range of 50 μm to 100 μm are used in IC chips for 2.5D or 3D packaging. However, metal pillar bumps face design and uniformity issues due to various process limitations, especially for monolithic microwave integrated circuit (MMIC) chips with a microstrip design. The MMIC chips are typically thinned to 100 μm or 50 μm. It is significantly challenging and expensive to fabricate metal pillar bumps with a height between 50 μm and 100 μm. The metal pillar bumps also have size and shape constraints. Further, significant portions of the substrates of the MMIC chips are removed and wasted in standard fabrication processes due to thin thickness requirements.

Accordingly, the object of the present disclosure is to provide an improved chip design suitable for 2.5D and 3D packaging integration without metal pillar challenges and limitations. In addition, the present chip design utilizes the substrate material to enhance cost effectiveness and design flexibility.

SUMMARY

The present disclosure relates to a semiconductor chip suitable for 2.5D and 3D packaging integration and a process for making the same. The disclosed semiconductor chip includes a substrate, a metal layer, and a number of component portions. Herein, the substrate has a substrate base and a number of protrusions at a backside of the substrate. Each protrusion protrudes from a bottom surface of the substrate base and has a same height. The substrate base and the protrusions are formed of a same material. At least one via hole extends vertically through one protrusion and the substrate base. The metal layer selectively covers exposed surfaces at a backside of the substrates and fully covers inner surfaces of the at least one via hole. The component portions reside over a top surface of the substrate base, such that a certain one of the component portions is electrically coupled to a portion of the metal layer at a top of the at least one via hole.

In one embodiment of the semiconductor chip, the substrate base and the protrusions are formed of silicon carbide (SiC), diamond, silicon (Si), or gallium arsenide (GaAs). The component portions include electronic components, which are formed of at least one of gallium nitride (GaN), GaAs, diamond, Si, silicon nitride, silicon oxide, tantalum nitride and nichrome.

In one embodiment of the semiconductor chip, the substrate base has a thickness between 25 μm and 100 μm, and each protrusion has a same height between 25 μm and 150 μm.

In one embodiment of the semiconductor chip, the metal layer is formed of gold (Au), copper (Cu), gold-tin (AuSn), or copper-tin (CuSn).

In one embodiment of the semiconductor chip, the metal layer has a thickness between 4 μm and 25 μm.

In one embodiment of the semiconductor chip, the protrusions include a number of bias pillar bases, the at least one via hole includes a number of bias via holes, and the bottom surface of the substrate base includes a number of isolation areas. Each bias via hole is located at the center of a corresponding bias pillar base, and extends vertically through the corresponding bias pillar base and the substrate base. Each isolation area surrounds a corresponding bias pillar base. The metal layer fully covers exposed surfaces of each bias pillar base, fully covers inner surfaces of each bias via hole, and does not cover any portion of the isolation areas.

In one embodiment of the semiconductor chip, the metal layer fully covers exposed portions of the bottom surface of the substrate base except the isolation areas.

In one embodiment of the semiconductor chip, each bias pillar base has a cylinder shape with a diameter between 10 μm and 150 μm, or has a cuboid shape with a bottom area between 10 μm×10 μm and 100 μm×100 μm. Each bias via hole is a circular via hole with a diameter between 5 μm and 60 μm, or a rectangular via hole with a bottom size between 5 μm×5 μm and 50 μm×50 μm.

In one embodiment of the semiconductor chip, each isolation area is a circular ring shape or a rectangular ring shape.

In one embodiment of the semiconductor chip, a ring width of each isolation area is between 5 μm and 100 μm.

In one embodiment of the semiconductor chip, the protrusions include a periphery ridge base that resides at a perimeter of the bottom surface of the substrate base, and the at least one via hole includes a number of periphery via holes. The periphery via holes are scattered within the periphery ridge base and each periphery via hole extends vertically through the periphery ridge base and the substrate base. The metal layer fully covers an exposed bottom surface and exposed inward-side surfaces of the periphery ridge base, and fully covers inner surfaces of each periphery via hole.

In one embodiment of the semiconductor chip, the periphery ridge base is continuous.

In one embodiment of the semiconductor chip, the periphery ridge base is discontinuous and includes separate periphery portions. Herein, the periphery via holes are located in certain ones of the periphery portions. The metal layer fully covers an exposed bottom surface of each periphery portion, and fully covers exposed side surfaces of each periphery portion except outward side surfaces of each periphery portion.

In one embodiment of the semiconductor chip, the protrusions include a number of ground pillar bases. The metal layer fully covers exposed surfaces of each ground pillar base, and covers portions of the bottom surface of the substrate base that surrounds each ground pillar base.

In one embodiment of the semiconductor chip, the at least one via hole includes a number of ground via holes. Each ground via hole is located at the center of a corresponding ground pillar base, and extends vertically through the corresponding ground pillar base and the substrate base. The metal layer fully covers inner surfaces of each ground via hole.

In one embodiment of the semiconductor chip, each ground pillar base has a cylinder shape with a diameter between 10 μm and 150 μm, or has a cuboid shape with a bottom area between 10 μm×10 μm and 100 μm×100 μm. Each ground via hole is a circular via hole with a diameter between 5 μm and 60 μm, or a rectangular via hole with a bottom size between 5 μm×5 μm and 50 μm×50 μm.

In one embodiment of the semiconductor chip, none of the ground pillar bases has any via hole. Each ground pillar base has a cylinder shape with a diameter between 10 μm and 150 μm, or has a cuboid shape with a bottom area between 10 μm×10 pm and 100 μm×100 μm.

In one embodiment of the semiconductor chip, the protrusions include an inner ridge base that resides at an interior portion of the bottom surface of the substrate base, and the at least one via hole includes a number of inner via holes. The inner via holes are scattered within the inner ridge base and each inner via hole extends vertically through the inner ridge base and the substrate base. The metal layer fully covers exposed surfaces of the inner ridge base and inner surfaces of each inner via hole to form an inner ridge structure, which is configured to provide radio frequency (RF) signal isolation between adjacent component portions located at opposite sides of the inner ridge structure.

In one embodiment of the semiconductor chip, the protrusions include a mesa base that resides at an interior portion of the bottom surface of the substrate base, and the at least one via hole includes a number of mesa via holes. The mesa via holes are scattered within the mesa base and each mesa via hole extends vertically through the mesa base and the substrate base. The metal layer fully covers exposed surfaces of the mesa base and inner surfaces of each mesa via hole to form a mesa structure, which is electrically coupled to one of the component portion, and configured to provide integrated thermal management of a corresponding component portion.

In one embodiment of the semiconductor chip, a size of the mesa structure is not smaller than the corresponding component portion, such that the mesa structure fully covers the corresponding component portion.

In one embodiment of the semiconductor chip, the protrusions provide at least one shape of a cylinder, a cube, and a cuboid.

In one embodiment of the semiconductor chip, the protrusions include a number of bias pillar bases and a number of ground pillar bases, the at least one via hole includes a number of bias via holes, and the bottom surface of the substrate base includes a number of isolation areas. Each bias via hole is located at the center of a corresponding bias pillar base, and extends vertically through the corresponding bias pillar base and the substrate base. Each isolation area surrounds a corresponding bias pillar base. The metal layer fully covers exposed surfaces of each bias pillar base, fully covers inner surfaces of each bias via hole, fully covers exposed surfaces of each ground pillar base, and fully covers exposed portions of the bottom surface of the substrate base except the isolation areas.

In one embodiment of the semiconductor chip, the at least one via hole further includes a number of ground via holes. Each ground via hole is located at the center of a corresponding ground pillar base, and extends vertically through the corresponding ground pillar base and the substrate base. The metal layer fully covers inner surfaces of each ground via hole.

In one embodiment of the semiconductor chip, each bias pillar base and each ground pillar base have a same shape and a same size.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 1A and B illustrate an exemplary semiconductor chip suitable for 2.5 dimensional (2.5D) and/or 3D packaging integration according to one embodiment of the present disclosure.

FIGS. 2-3 illustrate an alternative semiconductor chip suitable for 2.5 and/or 3D packaging integration.

FIGS. 4-10 provide exemplary steps that illustrate a process to fabricate the exemplary semiconductor chip shown in FIG. 1B.

Figure 1A:
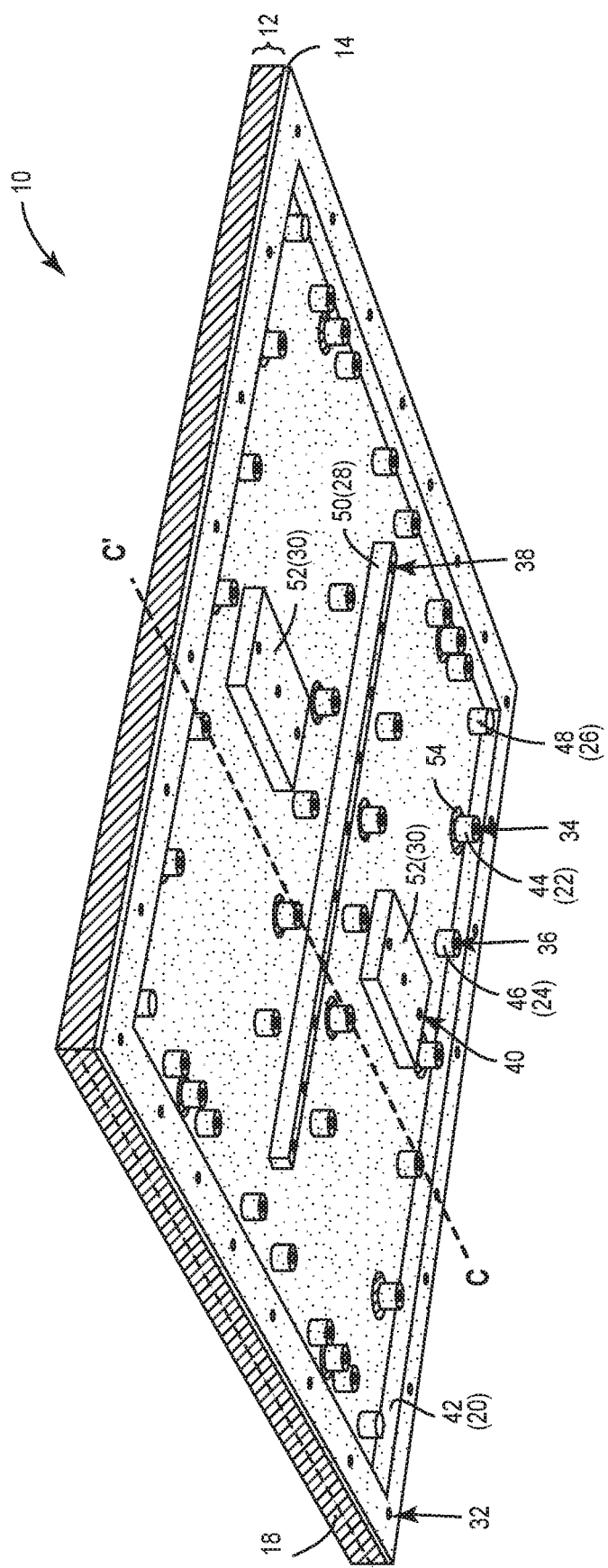

It will be understood that for clear illustrations, FIGS. 1A-13 may not be drawn to scale.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1B:
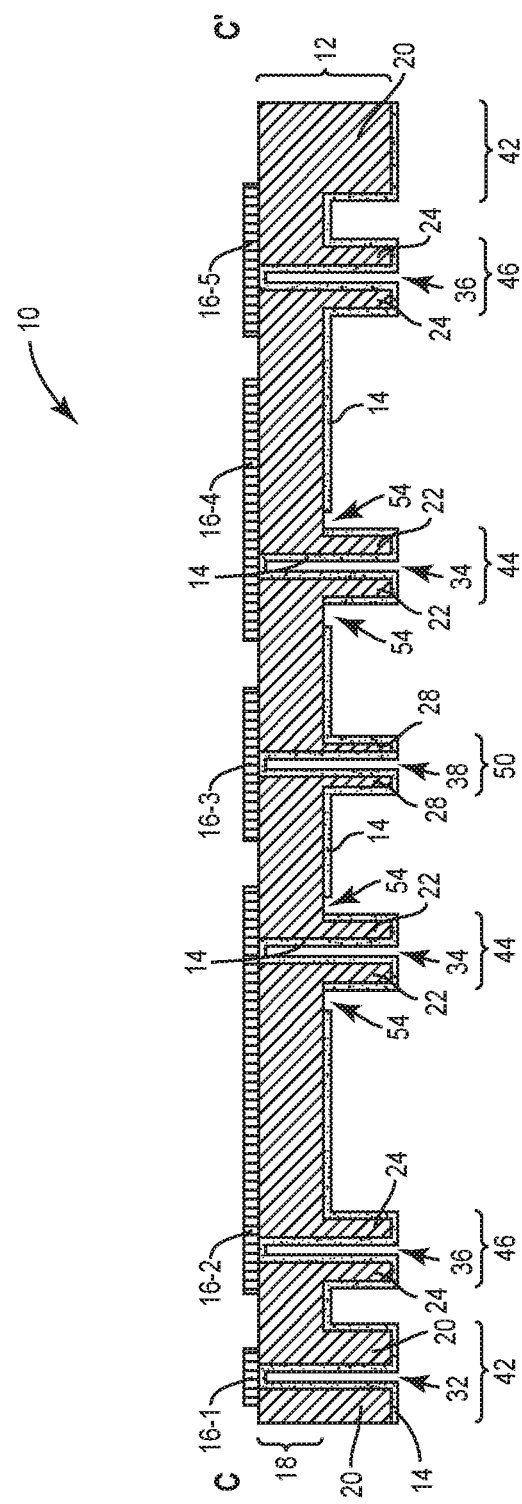

FIGS. 1A and 1B show an exemplary semiconductor chip 10 suitable for 2.5 dimensional (2.5D) and/or 3D packaging integration according to one embodiment of the present disclosure. FIG. 1A is a backside view of the semiconductor chip 10, while FIG. 1B is a cross-section view of the semiconductor chip 10 along the dashed line C-C'. For the purpose of this illustration, the semiconductor chip 10 includes a substrate 12, a metal layer 14, and component portions 16 (not shown in FIG. 1A) over a top surface of the substrate 12. Herein, FIG. 1B only shows the component portions 16-1~16-5 along the cross-section view of the semiconductor chip 10. The semiconductor chip 10 may include more component portions 16 in this embodiment. In different applications, the semiconductor chip 10 may include fewer or more component portions 16 over the top surface of the substrate 12.

In detail, the substrate 12 may be formed of silicon carbide (SiC), diamond, silicon (Si), gallium arsenide (GaAs), or the like. The substrate 12 includes a substrate base 18, a periphery ridge base 20, bias pillar bases 22, first ground pillar bases 24, second ground pillar bases 26 (for simplification and clarity, only one bias pillar base 22, one first ground pillar base 24, and one second ground pillar base 26 are labeled with reference numbers in FIG. 1A), an inner ridge base 28, and two mesa bases 30. The periphery ridge base 20 resides at the perimeter of a bottom surface of the substrate base 18. The bias pillar bases 22, the first ground pillar base 24, the second ground pillar bases 26, the inner ridge base 28, and the mesa bases 30 protrude from the bottom surface of the substrate base 18 and are surrounded by the periphery ridge base 20. The positions of the bias pillar bases 22, the first ground pillar bases 24, the second ground pillar bases 26, the inner ridge base 28, and the mesa bases 30 depend on the positions of the component portions 16 over the top surface of the substrate 12 (which is also a top surface of the substrate base 18).

Herein, a number of periphery via holes 32 (for simplification and clarity, only one periphery via hole 32 is labeled with a reference number in FIG. 1A) may be scattered within the periphery ridge base 20 and extend vertically through the periphery ridge base 20 and the substrate base 18 until reaching one corresponding component portion 16. A bias via hole 34 (for simplification and clarity, only one bias via hole 34 is labeled with a reference number in FIG. 1A) is located at the center of each bias pillar base 22 and extends vertically through the bias pillar base 22 and the substrate base 18 until reaching one corresponding component portion 16. A ground via hole 36 (for simplification and clarity, only one ground via hole 36 is labeled with a reference number in FIG. 1A) is located at the center of each first ground pillar base 24 and extends vertically through the first ground pillar base 24 and the substrate base 18 until reaching one corresponding component portion 16. There may be no via hole within any second ground pillar base 26. Inner via holes 38 (for simplification and clarity, only one inner via hole 38 is labeled with a reference number in FIG. 1A) may be scattered within the inner ridge base 28 and extend vertically through the inner ridge base 28 and the substrate base 18 until reaching one corresponding component portion 16. Mesa via holes 40 (for simplification and clarity, only one mesa via hole 40 is labeled with a reference number in FIG. 1A) may be scattered within each mesa base 30 and extend vertically through the mesa base 30 and the substrate base 18 until reaching one corresponding component portion 16.

The substrate base 18 may have a thickness between 25 μm and 100 μm, or between 50 μm and 100 μm. The periphery ridge base 20, each bias pillar base 22, each first ground pillar base 24, each second ground pillar base 26, the inner ridge base 28, and each mesa base 30 have a same height between 25 μm and 150 μm, or between 50 μm and 100 μm. Each periphery via hole 32 may be a circular via hole with a diameter between 5 μm and 60 μm, or a rectangular via hole with a bottom size between 5 μm×5 μm and 50 μm×50 μm. Each bias pillar base 22 may have a cylinder shape with a diameter between 10 μm and 150 μm, or may have a cuboid shape with a bottom area between 10 μm×10 μm and 100 μm×100 μm. Each bias via hole 34 may be a circular via hole with a diameter between 5 µm and 60 µm, or a rectangular via hole with a bottom size between 5 µm×5 µm and 50 µm×50 µm. Each first ground pillar base 24 may have a cylinder shape with a diameter between 10 µm and 150 µm, or may have a cuboid shape with a bottom area between 10 µm×10 µm and 100 µm×100 µm. Each ground via hole 36 may be a circular via hole with a diameter between 5 µm and 60 µm, or a rectangular via hole with a bottom size between 5 µm×5 µm and 50 µm×50 µm. Each second ground pillar base 26 may have a cylinder shape with a diameter between 10 µm and 150 µm, or may have or a cuboid shape with a bottom area between 10 µm×10 µm and 100 µm×100 µm. Each inner via hole 38 may be a circular via hole with a diameter between 5 µm and 60 µm, or a rectangular via hole with a bottom size between 5 µm×5 µm and 50 µm×50 µm. Each mesa via hole 40 may be a circular via hole with a diameter between 5 µm and 60 µm, or a rectangular via hole with a bottom size between 5 µm×5 µm and 50 µm×50 µm.

In some applications, the bias pillar bases 22, the first ground pillar bases 24, and the second pillar bases 26 may have a same size. In some applications, the bias pillar bases 22, the first ground pillar bases 24, and the second pillar bases 26 may have different sizes (not shown). In addition, the pillar bases 22/24/26 may provide other shapes such as cubes and/or cuboids.

The metal layer 14 may be discontinuous and selectively covers exposed surfaces at a backside of the substrate 12. In this illustration, the metal layer 14 completely covers an exposed bottom surface and exposed inward-side surfaces of the periphery ridge base 20, exposed surfaces of each bias pillar base 22, exposed surfaces of each first ground pillar base 24, exposed surfaces of each second ground pillar base 26, exposed surfaces of the inner ridge base 28, and exposed surfaces of each mesa base 30. In addition, the metal layer 14 also extends into each periphery via hole 32, each bias via hole 34, each ground via hole 36, each inner via hole 38, and each mesa via hole 40. Herein, the metal layer 14 fully covers inner surfaces within each periphery via hole 32, inner surfaces within each bias via hole 34, inner surfaces within each ground via hole 36, inner surfaces within each inner via hole 38, and inner surfaces within each mesa via hole 40. As such, each component portion 16 is connected to a certain portion of the metal layer 14 at a top of a corresponding via hole 32/34/36/38/40.

The periphery ridge base 20 and one corresponding portion of the metal layer 14, which covers the bottom surface and the inward side surfaces of the periphery ridge base 20 and the inner surfaces within each periphery via hole 32, form a periphery ridge 42. The periphery ridge 42 is electrically coupled to one component portion 16. Each bias pillar base 22 and one corresponding portion of the metal layer 14, which covers the exposed surfaces of the bias pillar base 22 and the inner surfaces within the bias via hole 34, form a bias pillar 44. Each bias pillar 44 is electrically coupled to one component portion 16. Each first ground pillar base 24 and one corresponding portion of the metal layer 14, which covers the exposed surfaces of the first ground pillar base 24 and the inner surfaces within the ground via hole 36, form a first ground pillar 46. Each first ground pillar 46 is electrically coupled to one component portion 16. Each second ground pillar base 26 and one corresponding portion of the metal layer 14, which covers the exposed surfaces of the second ground pillar base 26, form a second ground pillar 48. The inner ridge base 28 and one corresponding portion of the metal layer 14, which covers the exposed surfaces of the inner ridge base 28 and the inner surfaces within each inner via hole 38, form an inner ridge structure 50. The inner ridge structure 50 is configured to provide radio frequency (RF) signal isolation between adjacent component portions 16 (like 16-2 and 16-4) located at opposite sides of the inner ridge structure 50. Each mesa base 30 and one corresponding portion of the metal layer 14, which covers the exposed surfaces of the mesa base 30 and the inner surfaces within each mesa via hole 40, form a mesa structure 52. Each mesa structure 52 is electrically coupled to one component portion 16, and configured to provide integrated thermal management of the corresponding component portion 16. Typically, a size of each mesa structure 52 is large enough to cover the entire corresponding component portion 16, such that heat generated by the corresponding component portion 16 may be removed efficiently.

Further, the metal layer 14 fully covers exposed portions of the bottom surface of the substrate base 18 (through the periphery ridge base 20, each bias pillar base 22, each first ground pillar base 24, each second ground pillar base 26, the inner ridge base 28, and each mesa base 30), except isolation areas 54 (for simplification and clarity, only one isolation area 54 is labeled with a reference number in FIG. 1A). Each isolation area 54, which is a small exposed portion of the bottom surface of the substrate base 18, surrounds a corresponding bias pillar 44 (also surrounds a corresponding bias pillar base 22). As such, the metal layer 14 is discontinuous at each isolation area 54, and each bias pillar 44 may be electrically isolated from other protrusions (the periphery ridge 42, the first ground pillars 46, the second ground pillars 48, the inner ridge structure 50, the mesa structures 52, and other bias pillars 44) on the bottom surface of the substrate base 18. In one embodiment, each isolation area 54 may be a circular ring shape or a rectangular ring shape with a ring width between 5 µm and 100 µm. Herein, the periphery ridge 42, the first ground pillars 46, the second ground pillars 48, the inner ridge structure 50, and the mesa structures 52 may be electrically coupled together, to ground for instance, by the metal layer 14. The metal layer 14 may be formed of gold, copper, gold-tin, copper-tin, or likewise, with a thickness between 4 µm and 25 µm.

The component portions 16 may include routing traces/pads and electronic components, such as semiconductor devices, transistors, diodes, resistors, inductors and/or capacitors. The routing traces/pads may be used for internal chip connections and/or external chip connections for the semiconductor chip 10. For instance, a first component portion 16-1 may be a routing trace and electrically coupled to the periphery ridge 42. A second component portion 16-2 may be a semiconductor device and electrically coupled to one bias pillar 44 and one first ground pillar 46. A third component portion 16-3 may be another routing trace and electrically coupled to the inner ridge structure 50. A fourth component portion 16-4 may be another semiconductor device and electrically coupled to another bias pillar 44. A fifth component portion 16-5 may be a semiconductor transistor or a chip frontside metal pad and electrically coupled to another first ground pillar 46. Herein, the third component portion 16-3 may be coupled to the ground and configured to reduce electrical coupling between the second component portion 16-2 and the fourth component portion 16-4. The bias pillars 44 may be used as input/output (I/O) ports for signal transmitting of the second component portion 16-2 and the fourth component portion 16-4. For the component portions 16, the routing traces may be formed of metal materials, like copper, aluminum, and/or gold. The electronic components may be formed of gallium nitride (GaN), gallium arsenide (GaAs), diamond, Si, dielectric materials (such as silicon nitride or silicon oxide), and/or metals (such as tantalum nitride or nichrome).

Figure 2:
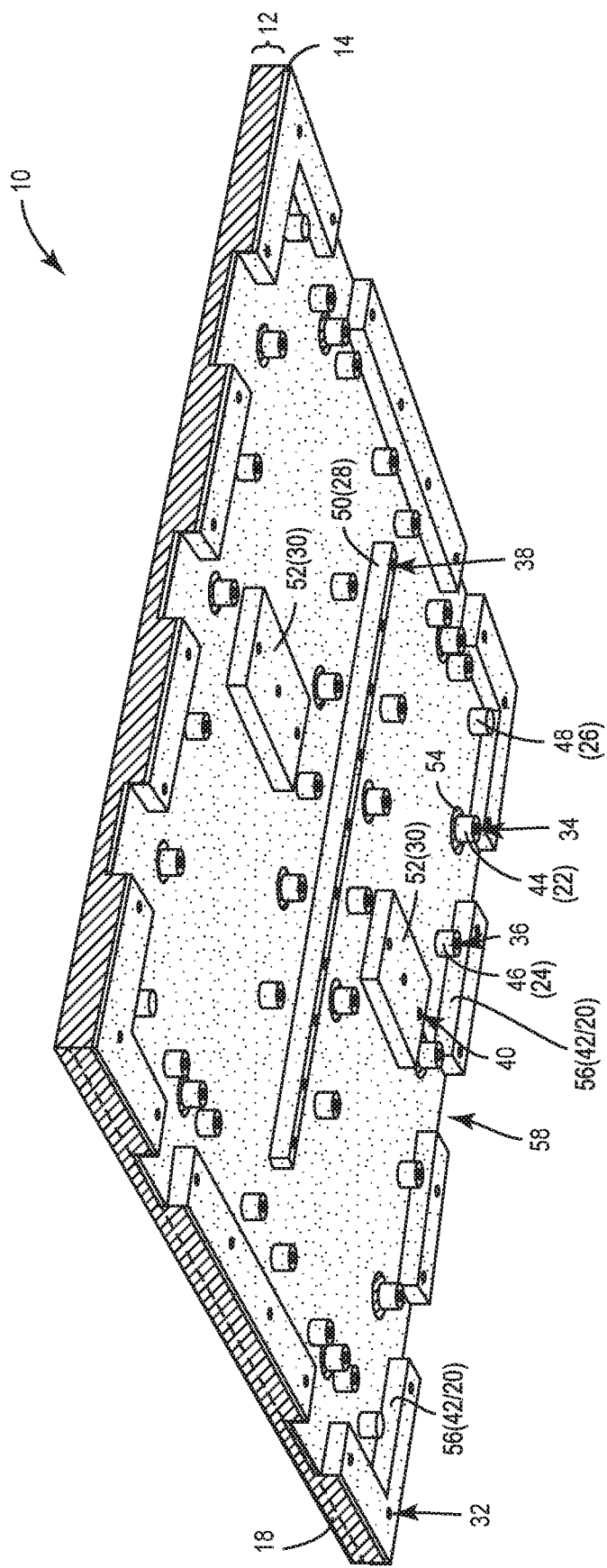

As illustrated in FIG. 1A, the periphery ridge base 20 as well as the periphery ridge 42 is continuous. When the semiconductor chip 10 is stacked with another semiconductor chip or a semiconductor interposer, the periphery ridge 42 provides a hermetic seal to the protrusions that are surrounded by the periphery ridge 42 (each bias pillar base 22, each first ground pillar base 24, each second ground pillar base 26, the inner ridge base 28, and each mesa base 30). In another embodiment, the periphery ridge base 20 is discontinuous, as illustrated in FIG. 2. For the purpose of this illustration, the periphery ridge base 20 includes ten discontinuous periphery portion bases 56 with a gap 58 between adjacent ones (for simplification and clarity, only two periphery portion bases 56 and one gap 58 are labeled with reference numbers). Each periphery portion base 56 resides at the perimeter of the bottom surface of the substrate base 18 and includes one or more periphery via holes 32 (for simplification and clarity, only one periphery via hole 32 is labeled with a reference number). Herein, the metal layer 14 covers an exposed bottom surface and certain exposed side surfaces (all exposed side surfaces except outward side surfaces) of each periphery portion base 56, covers the inner surfaces within each periphery via hole 32, and covers exposed portions of the bottom surface of the substrate base 18 (through each periphery portion base 56, each bias pillar base 22, each first ground pillar base 24, each second ground pillar base 26, the inner ridge base 28, and each mesa base 30) except the isolation areas 54.

In this illustration, the periphery ridge 42 is formed by a combination of the periphery portion bases 56 and corresponding portions of the metal layer 14 (covering the bottom surface and the certain side surfaces of each periphery portion base 56, and the inner surfaces within each periphery via hole 32). The periphery ridge 42 is still electrically connected to the first ground pillars 46, the second ground pillars 48, the inner ridge structure 50, and the mesa structures 52. When the semiconductor chip 10 is stacked with another semiconductor chip or a semiconductor interposer, an underfilling material may be inserted via the gaps 58 (not shown here). The underfilling material may fill interspaces among the protrusions (each bias pillar base 22, each first ground pillar base 24, each second ground pillar base 26, the inner ridge base 28, and each mesa base 30) within the periphery ridge 42. In addition, the gaps 58 allow routing lines between the semiconductor chip 10 and the stacked semiconductor chip/interposer beyond the periphery of the substrate 12.

Figure 3:
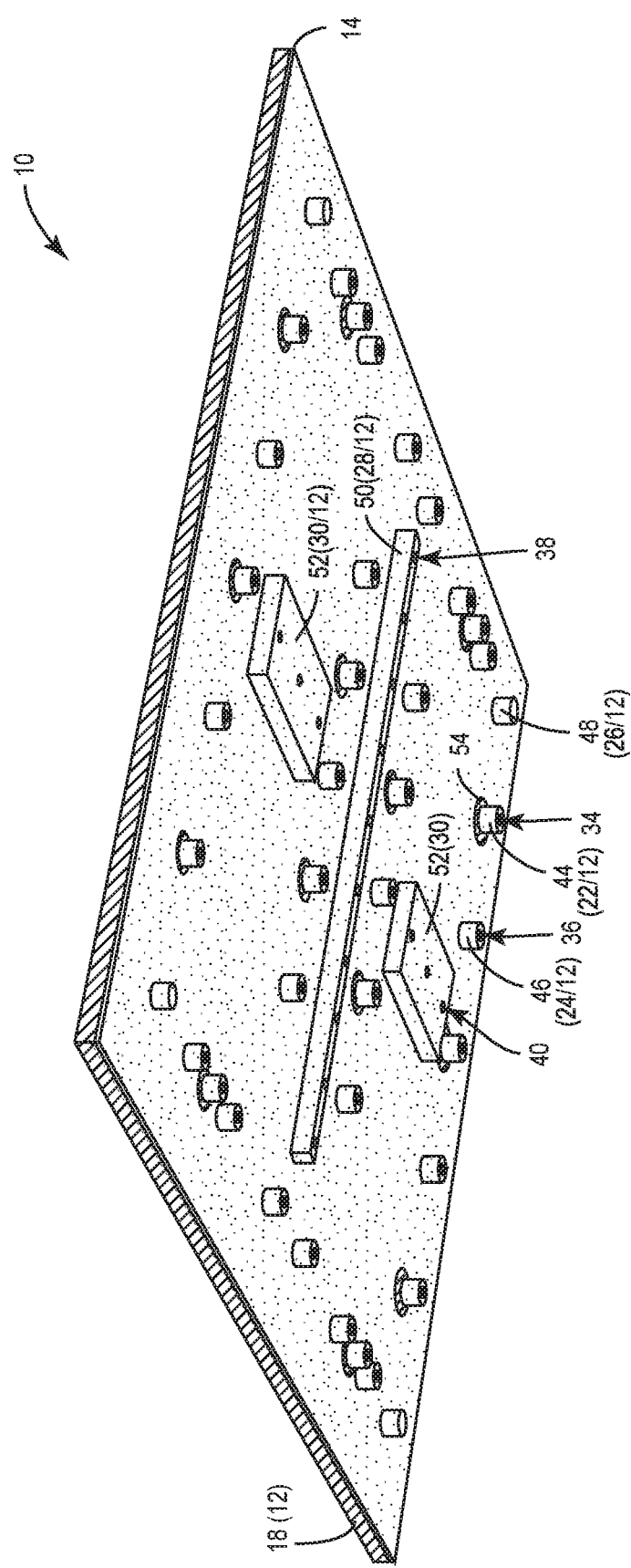

Alternatively, in some applications, the periphery ridge base 20 is omitted in the substrate 12, as illustrated in FIG. 3. Herein, the metal layer 14 covers periphery portions of the bottom surface of the substrate base 18. Because there is no periphery ridge base 20, when the semiconductor chip 10 is stacked with another semiconductor chip or the semiconductor interposer, the underfilling material may be applied (not shown here, more details in the following discussion) between the semiconductor chip 10 and the stacked semiconductor chip/interposer. The underfilling material may fill interspaces among the protrusions (each bias pillar base 22, each first ground pillar base 24, each second ground pillar base 26, the inner ridge base 28, and each mesa base 30), which protrude from the bottom surface of the substrate base 18. In this case, the routing lines between the semiconductor chip 10 and the stacked semiconductor chip/interposer may be also allowed to be beyond the periphery of the substrate 12.

FIGS. 4-10 provide exemplary steps that illustrate a process to fabricate the exemplary semiconductor chip 10 (the cross-section view) shown in FIG. 1B. Although the exemplary steps are illustrated in a series, the exemplary steps are not necessarily order dependent. Some steps may be done in a different order than that presented. Further, processes within the scope of this disclosure may include fewer or more steps than those illustrated in FIGS. 4-10. The fabrication process to form the semiconductor chip 10 may be done at a wafer level.

Figure 4:
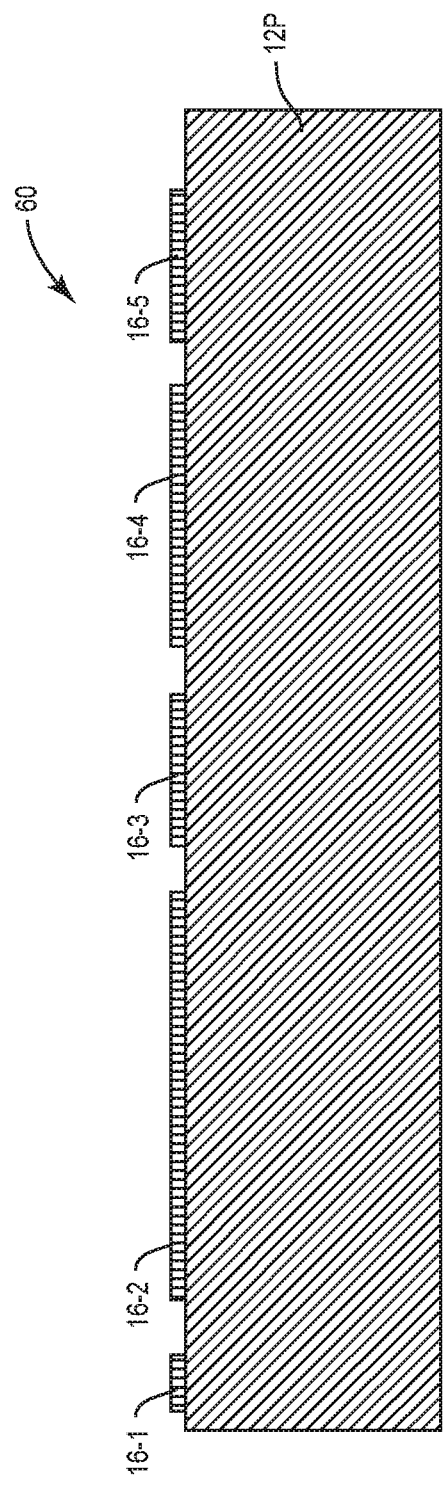

Initially, a precursor wafer 60, which includes a precursor substrate 12P and the component portions 16 over a top surface of the precursor substrate 12P, is provided as illustrated in FIG. 4. FIG. 4 only shows the component portions 16-1~16-5 along a cross-section view of the precursor wafer 60. Therefore, the precursor wafer 60 may include more component portions 16 in this illustration. In different applications, the precursor wafer 60 may include fewer or more component portions 16 over the top surface of the precursor substrate 12P. The precursor substrate 12P may be formed of SiC, diamond, Si, or GaAs, with a thickness between 400 μm and 700 μm. The component portions 16 may include routing traces/pads and electronic components, such as semiconductor devices, transistors, diodes, resistors, inductors and/or capacitors. Herein, the routing traces/pads may be formed of metal materials, like copper, aluminum, and gold, while the electronic components may be formed of GaN, GaAs, diamond, Si, dielectric materials (such as silicon nitride or silicon oxide), and/or metals (such as tantalum nitride or nichrome).

Figure 5:
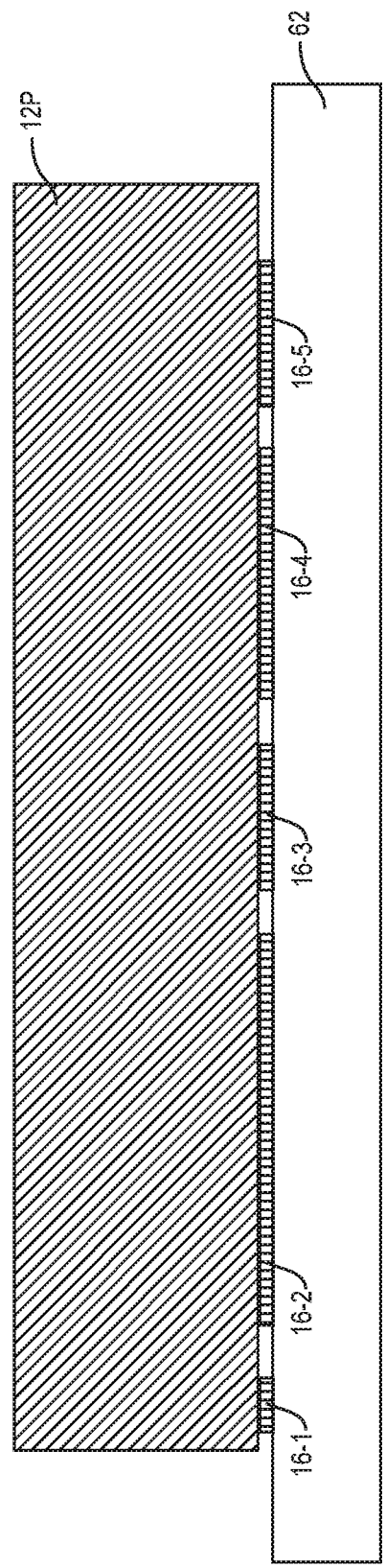
Figure 6:
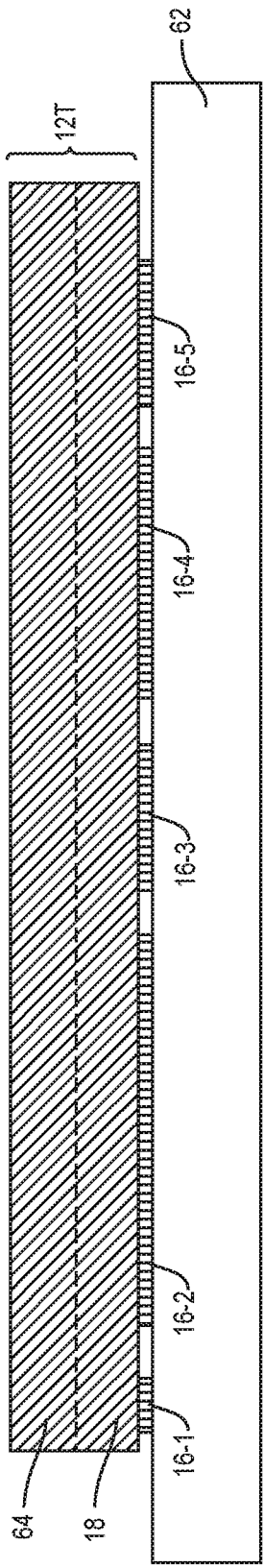

Next, the precursor wafer 60 is flipped and mounted on a carrier 62, as illustrated in FIG. 5. As such, the component portions 16 are at the bottom of the precursor wafer 60, and a backside of the precursor substrate 12P is at the top of the precursor wafer 60. The precursor substrate 12P is then thinned down from the backside of the precursor substrate 12P to provide a thinned substrate 12T, as illustrated in FIG. 6. A mechanical grinding process and/or a polishing process may be utilized to thin down the precursor substrate 12P. The thinned substrate 12T includes the substrate base 18 adjacent to the component portions 16 and an etchable region 64 over the substrate base 18. The thinned substrate 12T may have a thickness between 50 μm and 250 μm, the substrate base 18 may have a thickness between 25 μm and 100 μm, and the etchable region 64 may have a thickness between 25 μm and 150 μm.

Figure 7:
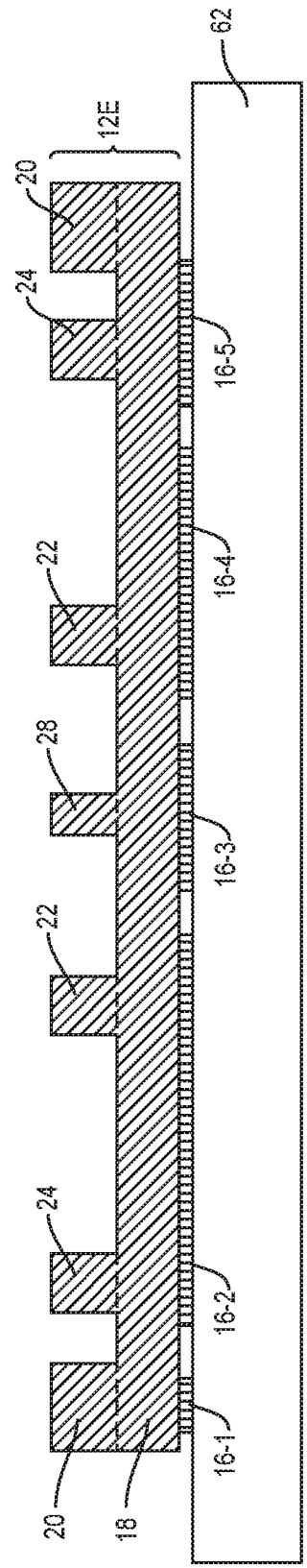

FIG. 7 shows a selective etching step to provide an etched substrate 12E from the thinned substrate 12T. Herein, the substrate base 18 is retained, while selective substrate portions are etched away from the etchable region 64 so as to generate a number of separate protrusions, such as the periphery ridge base 20, the bias pillar bases 22, the first ground pillar bases 24, and the inner ridge base 28. In some applications, the protrusions generated by selectively etching may also include the mesa bases and/or the second ground pillar bases (not shown). The periphery ridge base 20 may be continuous or discontinuous. In another embodiment, the periphery ridge base 20 may be omitted in the etched substrate 12E.

Each etched substrate portion has a same thickness as the etchable region 64. Therefore, portions of the substrate base 18 are exposed through the protrusions, and each protrusion (the periphery ridge base 20, each bias pillar base 22, each first ground pillar base 24, and the inner ridge base 28) has a same height protruding from the substrate base 18. For monolithic microwave integrated circuit (MMIC) applications, precise thickness control is critical. The thickness of the substrate base 18 is between 25 μm and 100 μm, or between 50 μm and 100 μm, while the height of each protrusion is between 25 μm and 150 μm, or between 50 μm and 100 μm. The etching step may be implemented by a reactive ion etching process.

Figure 8:
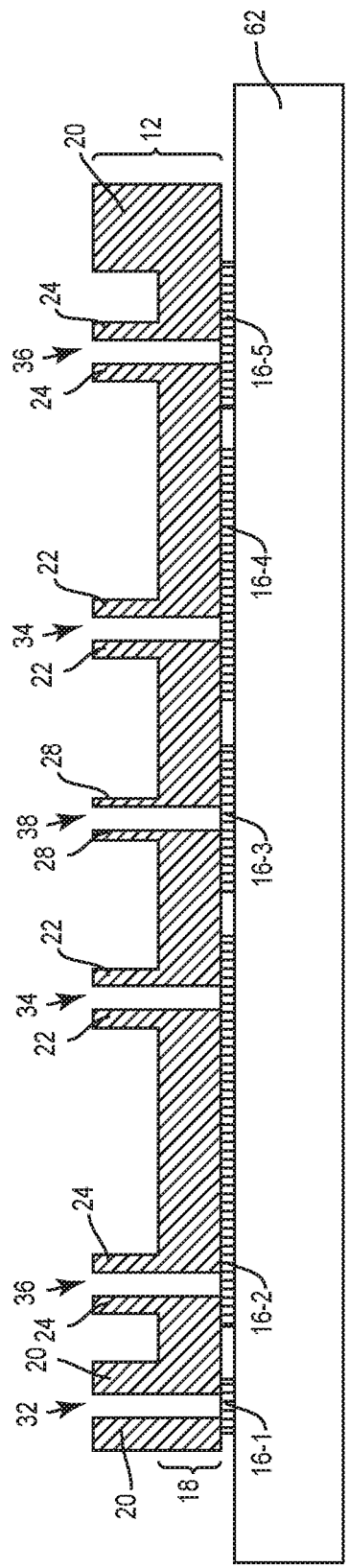

Different via holes are then formed to complete the final substrate 12, as illustrated in FIG. 8. The periphery via holes 32 (only one periphery via hole 32 is shown in FIG. 8 along the cross-section view) are formed within the periphery ridge base 20 and extend vertically through the periphery ridge base 20 and the substrate base 18 until reaching one corresponding component portion 16. One bias via hole 34 is formed at the center of each bias pillar base 22 and extends vertically through the corresponding bias pillar base 22 and the substrate base 18 until reaching one corresponding component portion 16. One ground via hole 36 is formed at the center of each first ground pillar base 24 and extends vertically through the corresponding first ground pillar base 24 and the substrate base 18 until reaching one corresponding component portion 16. The inner via holes 38 (only one inner via hole 38 is shown in FIG. 8 along the cross-section view) are formed within the inner ridge base 28 and extend vertically through the inner ridge base 28 and the substrate base 18 until reaching one corresponding component portion 16. If the substrate 12 also includes one or more mesa bases, the mesa via holes may be formed within each mesa base and extend vertically through the corresponding mesa base and the substrate base 18 until reaching one corresponding component portion 16 (not shown). There may be no via hole formed within any second ground pillar base (not shown). The periphery via holes 32, the bias via holes 34, the ground via holes 36, and the inner via holes 38 may be formed by a reactive ion etching process.

Figure 9:
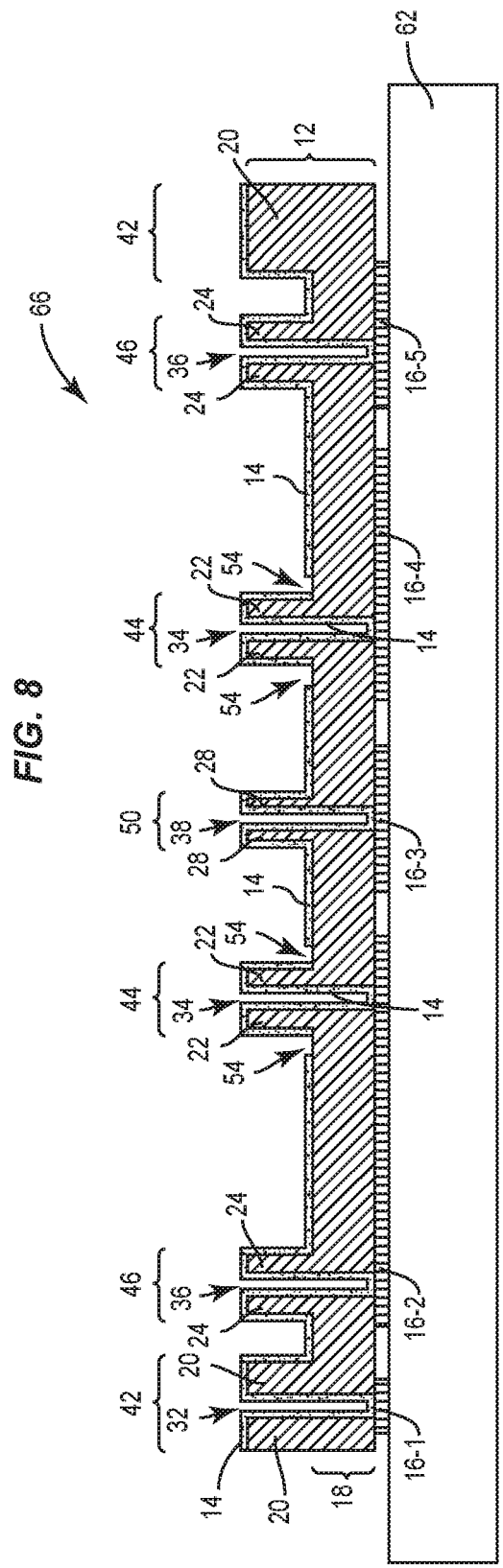

Next, the metal layer 14 is selectively applied to the substrate 12 to provide a semiconductor wafer 66, as illustrated in FIG. 9. Herein, the metal layer 14 completely covers the inner surfaces of each via hole (32/34/36/38) and completely covers exposed surfaces at the backside of the substrate 12 (including the bottom surface and the inward-side surfaces of the periphery ridge base 20, the exposed surfaces of each bias pillar base 22, the exposed surfaces of each first ground pillar base 24, the exposed surfaces of the inner ridge base 28, and the exposed portions of the bottom surface of the substrate base 18) except the isolation areas 54 of the bottom surface of the substrate base 18. Each isolation area 54 surrounds a corresponding bias pillar base 22 and the metal layer 14 is discontinuous at each isolation area 54.

In this step, the periphery ridge 42 is formed by the periphery ridge base 20 and one corresponding portion of the metal layer 14, and electrically coupled to one component portion 16. Each bias pillar 44 is formed by one bias pillar base 22 and one corresponding portion of the metal layer 14, and electrically coupled to one component portion 16. Each first ground pillar 46 is formed by one first ground pillar base 24 and one corresponding portion of the metal layer 14, and electrically coupled to one component portion 16. The inner ridge structure 50 is formed by the inner ridge base 28 and one corresponding portion of the metal layer 14, and electrically coupled to one component portion 16. Herein, each bias pillar 44 may be electrically isolated from other protrusions (the periphery ridge 42, the first ground pillars 46, the inner ridge structure 50, and other bias pillars 44) because of the corresponding isolation area 54. The periphery ridge 42, the first ground pillars 46, and the inner ridge structure 50 may be electrically coupled together, to ground for instance, by the metal layer 14. The metal layer 14 may be formed of gold, copper, gold-tin, copper-tin, or likewise by a combination of sputtering and electroplating process. The thickness of the metal layer 14 may be between 4 μm and 25 μm.

Figure 10:
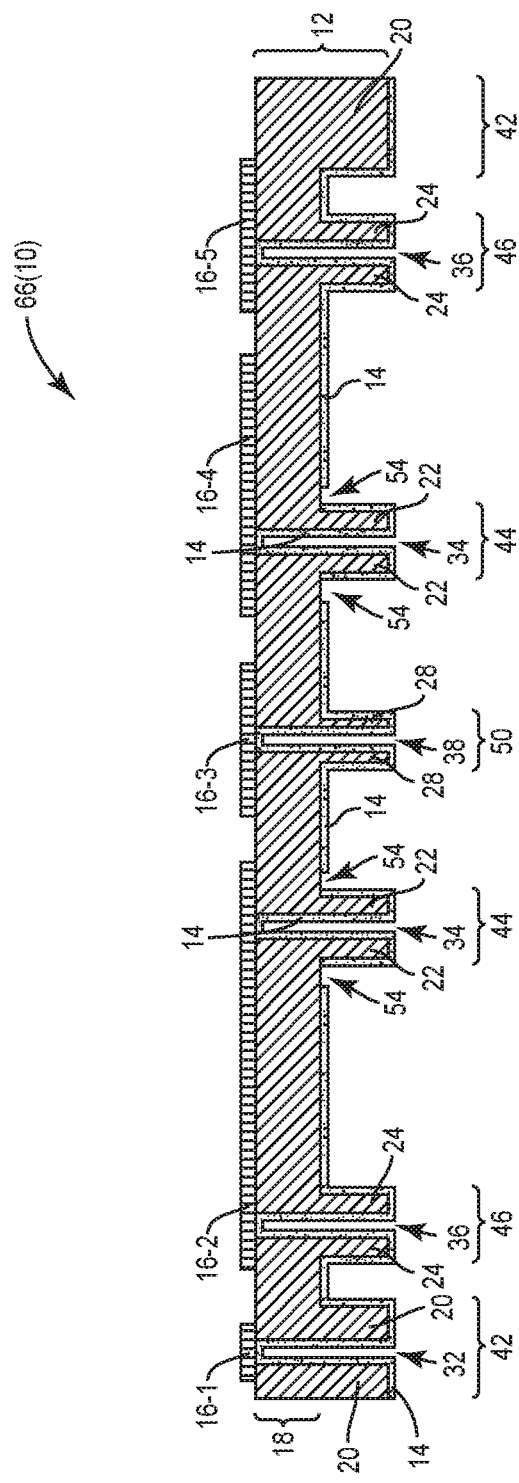

The semiconductor wafer 66 is then demounted from the carrier 62, and flipped upside down, as illustrated in FIG. 10. Lastly, the semiconductor wafer 66 may be marked, diced, and singulated into individual chips (not shown). The semiconductor chip 10 is an exemplary singulated chip, which is ready for 2.5D and/or 3D packaging integrations.

Compared to a conventional periphery ridge, conventional bias pillars, conventional ground pillars, and a conventional inner ridge formed of metals, the periphery ridge 42, the bias pillars 44, the first ground pillars 46, and the inner ridge structure 50 utilize portions of the substrate 12, which are otherwise wasted in a standard wafer fabrication process (to get a desired thickness of the substrate base 18). In addition, if the thickness of the substrate base 18 is required to be superiorly thin, like 50 μm in the MMIC applications, it becomes a great mechanical challenge to form metal pillars with a height between 50 μm and 100 μm (for 2.5D or 3D packaging integrations). Further, the conventional metal periphery ridge and the conventional metal pillars are difficult to form at the chip edge. Therefore, the improved semiconductor chip 10 is more cost effective and provides better design flexibilities.

Figure 11:
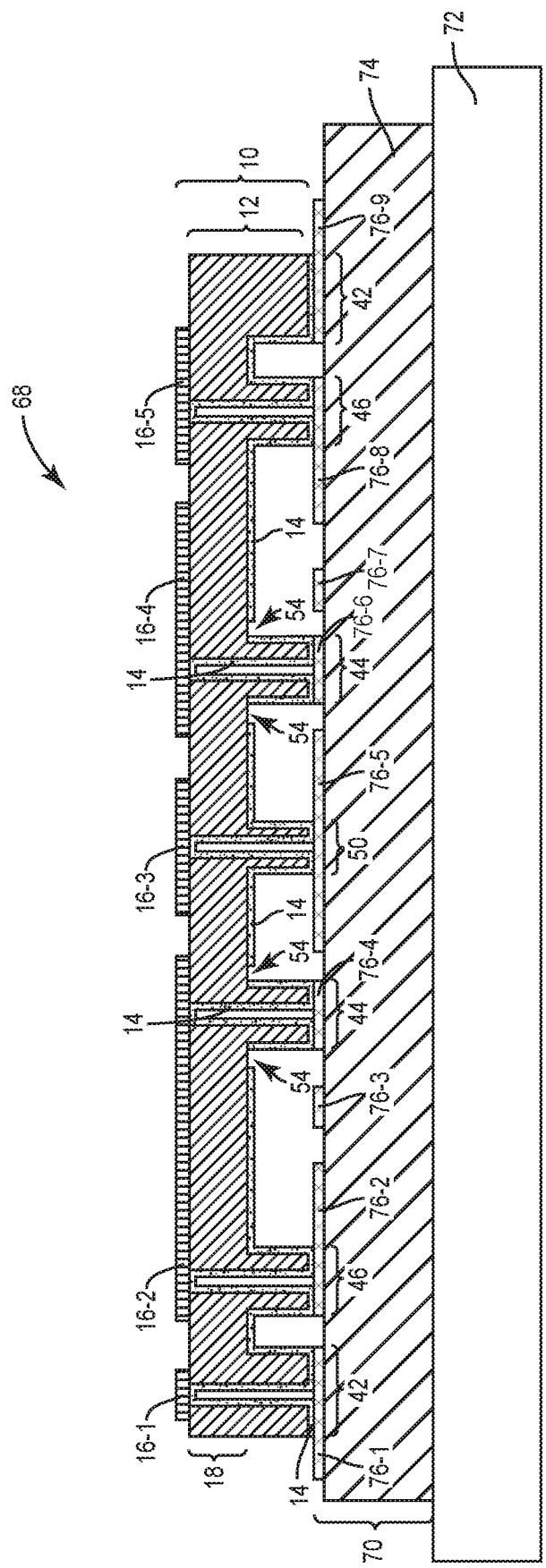
FIG. 11 illustrates an exemplary 2.5D package with the semiconductor chip shown in FIG. 1B.

FIG. 11 illustrates an exemplary 2.5D package 68 with the semiconductor chip 10 (for simplification and clarity, only selective components of the semiconductor chip 10 are labeled with reference numbers) shown in FIG. 1B. Besides the semiconductor chip 10, the 2.5D package 68 also includes a package interposer 70 underneath the semiconductor chip 10 and a package substrate 72 underneath the package interposer 70. The package interposer 70 has an interposer substrate 74 and interposer pads 76 over a top surface of the interposer substrate 74. The interposer substrate 74 may include dielectric layers and multilevel interconnect layers that are separated by the dielectric layers and electrically connected by vias (not shown). The interposer pads 76 are located corresponding to the protrusion features of the semiconductor chip 10 (the periphery ridge 42, the bias pillars 44, the first ground pillars 46, the inner ridge structure 50, and other no-shown protrusions) at the backside of the semiconductor chip 10. As such, each protrusion will be attached to a corresponding interposer pad 76. In addition, some interposer pads 76 may be used for internal chip connections and/or external chip connections for the semiconductor chip 10.

For the purpose of this illustration, the package interposer 70 includes nine interposer pads 76-1~76-9. A first interposer pad 76-1 and a ninth interposer pad 76-9 are electrically coupled to the periphery ridge 42 as well as the first component portion 16-1. Herein, the first interposer pad 76-1 and the ninth interposer pad 76-9 may be separate or connected continuously. A second interposer pad 76-2 is electrically coupled to one ground pillar 46 and a fourth interposer pad 76-4 is electrically coupled to one bias pillar 44. Both the second interposer pad 76-2 and the fourth interposer pad 76-4 are electrically coupled to the second component portion 16-2, where the second interposer pad 76-2 may be configured to provide a ground voltage to the second component portion 16-2, and the fourth interposer pad 76-4 may be configured to transmit signals to the second component portion 16-2. A fifth interposer pad 76-5 is electrically coupled to the inner ridge pillar 50 as well as the third component portion 16-3. A sixth interposer pad 76-6 is electrically coupled to another bias pillar 44 as well as the fourth component portion 16-4. An eighth interposer pad 76-8 is electrically coupled to another first ground pillar 46 as well as the fifth component portion 16-5. The first, second, fourth, fifth, sixth, eighth and ninth interposer pads 76-1, 76-2, 76-4, 76-5, 76-6, 76-8, and 76-9 are landing pads and directly in contact with the protrusions on the bottom surface of the substrate base 18. A third interposer pad 76-3 and a seventh interposer pad 76-7 may be used for internal chip connections and/or external chip connections for the semiconductor chip 10.

In one embodiment, horizontal dimensions of the package interposer 70 may be the same as the semiconductor chip 10. In another embodiment, the horizontal dimensions of the package interposer 70 may be larger than the semiconductor chip 10 to allow integration of multiple semiconductor chips on the package interposer 70. The attachment of the semiconductor chip 10 to the package interposer 70 may be performed by an epoxy attaching process, an eutectic attaching process, a direct metal-metal thermo-compression bonding process, or the like.

Figure 12:
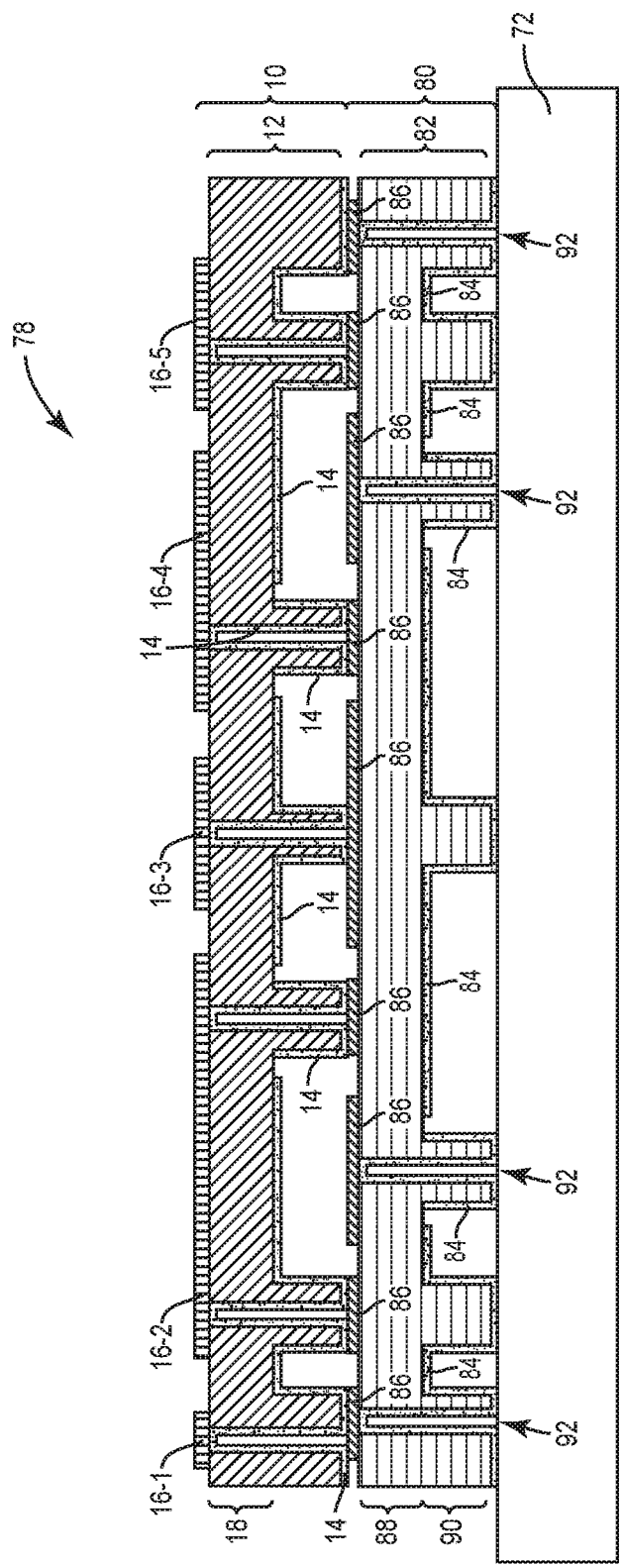
FIG. 12 illustrates an exemplary 3D package with the semiconductor chip shown in FIG. 1B.

FIG. 12 illustrates an exemplary 3D package 78 with the semiconductor chip 10 (for simplification and clarity, only selective components of the semiconductor chip 10 are labeled with reference numbers) shown in FIG. 1B. Besides the semiconductor chip 10, the 3D package 78 includes an additional semiconductor chip 80 stacked underneath the semiconductor chip 10, and the package substrate 72 is underneath the additional semiconductor chip 80. Herein, the additional semiconductor chip 80 may be formed by similar process steps as those illustrated in FIGS. 4-10.

The additional semiconductor chip 80 includes an alternative substrate 82, an alternative metal layer 84, and alternative component portions 86 over a top surface of the alternative substrate 82. The alternative substrate 82 has an alternative substrate base 88 and a number of alternative protrusions 90 protruding from a bottom surface of the alternative substrate base 88. The alternative substrate base 88 may have a thickness between 25 μm and 100 μm, or between 50 μm and 100 μm, while each alternative each protrusion 90 has a same height between 25 μm and 150 μm, or between 50 μm and 100 μm. In different applications, the alternative protrusions 90 may include a periphery ridge base, bias pillar bases, ground pillar bases, one or more inner ridge bases, and/or one or more mesa bases. Within some of the alternative protrusions 90, there may be one or more via holes 92 formed, which extend through the corresponding alternative protrusion 90 and the alternative substrate base 88. The alternative metal layer 84 selectively covers exposed surfaces at a backside of the alternative substrate 12 and fully covers inner surfaces within each via hole 92.

The alternative component portions 86 may include routing traces/pads and electronic components (like semiconductor devices, transistors, diodes, resistors, capacitors formed by monolithic fabrication). The routing traces/pads may be used for internal chip connections and/or external chip connections for the additional semiconductor chip 80. Locations of the alternative component portion 86 are compatible with the protrusion features of the semiconductor chip 10 (the periphery ridge 42, the bias pillars 44, the first ground pillars 46, the inner ridge structure 50, and other no-shown protrusions). As such, each protrusion in the semiconductor 10 will be attached to a corresponding alternative component portion 86. Herein, the electronic components in the additional semiconductor chip 80 may be formed of GaN, GaAs, diamond, Si, dielectric materials, and/or metals. In different applications, the electronic components in the additional semiconductor chip 80 and the electronic components in the semiconductor chip 10 may be formed of a same or different material. The alternative substrate 82 in the additional semiconductor chip 80 may be formed of SiC, diamond, GaAs, Si, or the like. In different applications, the alternative substrate 82 in the additional semiconductor chip 80 and the substrate 12 in the semiconductor chip 10 may be formed of a same or different material. In addition, the alternative metal layer 84 may be formed of gold, copper, gold-tin, copper-tin, or likewise, with a thickness between 4 μm and 25 μm. In different applications, the alternative metal layer 84 in the additional semiconductor chip 80 and the metal layer 14 in the semiconductor chip 10 may be formed of a same or different material.

In one embodiment, horizontal dimensions of the additional semiconductor chip 80 may be the same as or larger than the semiconductor chip 10. The attachment of the semiconductor chip 10 to the alternative semiconductor chip 80 may be performed by an epoxy attaching process, a eutectic attaching process, a direct metal-metal-thermo-compression bonding process, or the like.

Figure 13:
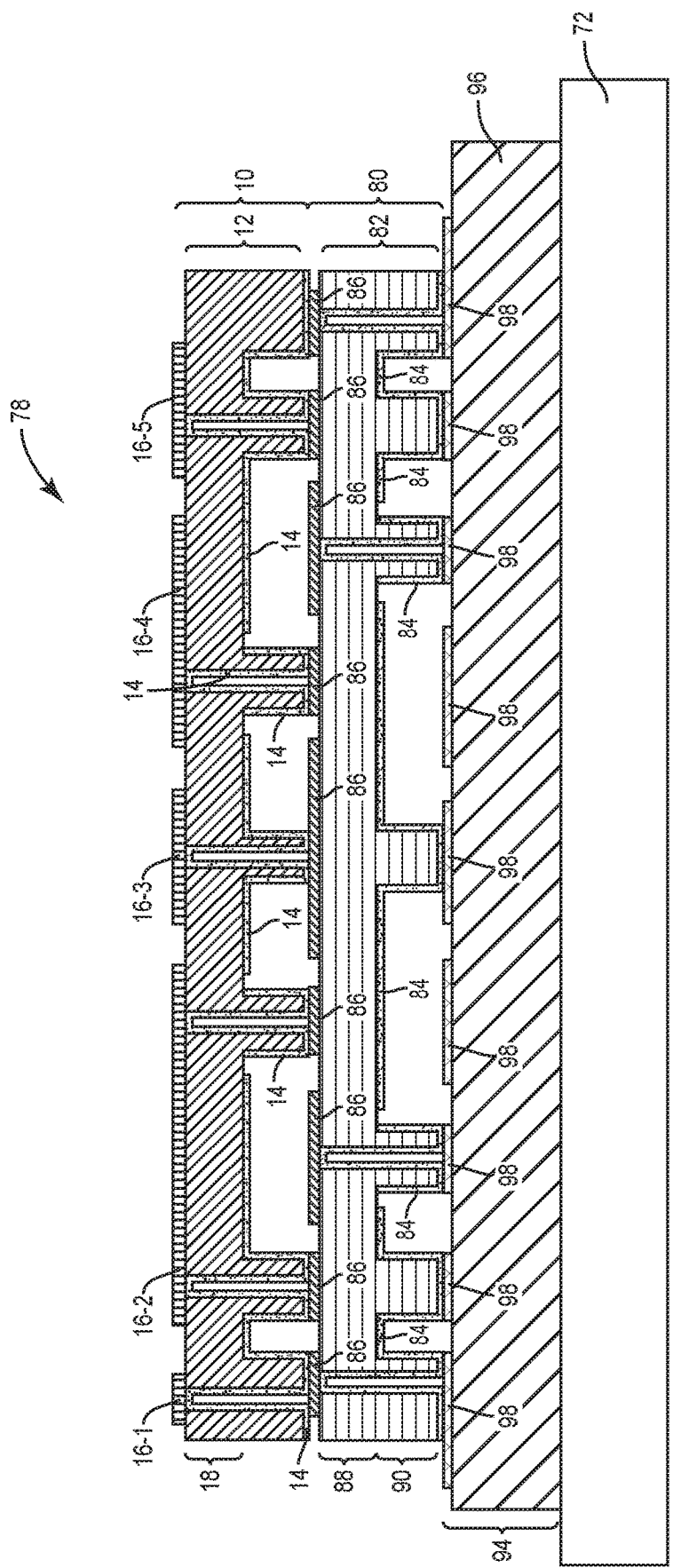
FIG. 13 illustrates an alternative 3D package with the semiconductor chip shown in FIG. 1B.

In some applications, the 3D package 78 may further include an alternative package interposer 94 coupled between the additional semiconductor chip 80 and the package substrate 72, as illustrated in FIG. 13. The alternative package interposer 94 has an alternative interposer substrate 96 and alternative interposer pads 98 over a top surface of the alternative interposer substrate 96. The alternative interposer pads 98 are located corresponding to the alternative protrusions 90 of the additional semiconductor chip 80. As such, each alternative protrusion 90 will be attached to a corresponding alternative interposer pad 98. In addition, some alternative interposer pads 98 may be used for internal chip connections and/or external chip connections for the additional semiconductor chip 80.

In one embodiment, horizontal dimensions of the alternative package interposer 94 may be same as the additional semiconductor chip 80. In another embodiment, the horizontal dimensions of the alternative package interposer 94 may be larger than the additional semiconductor chip 80 to allow integration of other semiconductor chips directly on the alternative package interposer 94. The attachment of the additional semiconductor chip 80 to the alternative package interposer 94 may be performed by an epoxy attaching process, a eutectic attaching process, a direct metal-metal thermo-compression bonding process, or the like.

Those skilled in the art will recognize improvements and modifications to the preferred embodiments of the present disclosure. All such improvements and modifications are considered within the scope of the concepts disclosed herein and the claims that follow.

What is claimed is:

1. An apparatus comprising:
 a substrate including a substrate base and a plurality of protrusions at a backside of the substrate, wherein:
  each of the plurality of protrusions protrudes from a bottom surface of the substrate base and has a same height;
  the substrate base and the plurality of protrusions are formed of a same material; and
  at least one via hole extends vertically through one of the plurality of protrusions and the substrate base;
 a metal layer selectively covering exposed surfaces at the backside of the substrate and fully covering inner surfaces of the at least one via hole; and a plurality of component portions over a top surface of the substrate base, such that a certain one of the plurality of component portions is electrically coupled to a portion of the metal layer at a top of the at least one via hole.

2. The apparatus of claim 1 wherein:
the substrate base and the plurality of protrusions are formed of silicon carbide (SiC), diamond, silicon (Si), or gallium arsenide (GaAs); and
the plurality of component portions includes electronic components, which are formed of at least one of a group consisting of gallium nitride (GaN), GaAs, diamond, Si, silicon nitride, silicon oxide, tantalum nitride and nichrome.

3. The apparatus of claim 1 wherein the substrate base has a thickness of 25 μm and 100 μm, and each of the plurality of protrusions has a same height between 25 μm and 150 82 m.

4. The apparatus of claim 1 wherein the metal layer is formed of gold (Au), copper (Cu), gold-tin (AuSn), or copper-tin (CuSn).

5. The apparatus of claim 1 wherein the metal layer has a thickness between 4 μm and 25 μm.

6. The apparatus of claim 1 wherein:
the plurality of protrusions includes a plurality of bias pillar bases, the at least one via hole includes a plurality of bias via holes, and the bottom surface of the substrate base includes a plurality of isolation areas;
each of the plurality of bias via holes is located at a center of a corresponding bias pillar base, and extends vertically through the corresponding bias pillar base and the substrate base;
each of the plurality of isolation areas surrounds a corresponding bias pillar base; and
the metal layer fully covers exposed surfaces of each of the plurality of bias pillar bases, fully covers inner surfaces of each of the plurality of bias via holes, and does not cover any portion of the plurality of isolation areas.

7. The apparatus of claim 6 wherein the metal layer fully covers exposed portions of the bottom surface of the substrate base except the plurality of isolation areas.

8. The apparatus of claim 6 wherein:
each of the plurality of bias pillar bases has a cylinder shape with a diameter between 10 μm and 150 μm, or has a cuboid shape with a bottom area between 10 μm×10 μm and 100 μm×100 μm; and
each of the plurality of bias via holes is a circular via hole with a diameter between 5 μm and 60 μm, or a rectangular via hole with a bottom size between 5 μm×5 μm and 50 μm×50 μm.

9. The apparatus of claim 6 wherein each of the plurality of isolation areas is a circular ring shape or a rectangular ring shape.

10. The apparatus of claim 9 wherein a ring width of each isolation area is between 5 μm and 100 μm.

11. The apparatus of claim 1 wherein:
the plurality of protrusions includes a periphery ridge base that resides at a perimeter of the bottom surface of the substrate base, and the at least one via hole includes a plurality of periphery via holes;
the plurality of periphery via holes is scattered within the periphery ridge base and each of the plurality of periphery via holes extends vertically through the periphery ridge base and the substrate base; and
the metal layer fully covers an exposed bottom surface and exposed inward-side surfaces of the periphery ridge base, and fully covers inner surfaces of each of the plurality of periphery via holes.

12. The apparatus of claim 11 wherein the periphery ridge base is continuous.

13. The apparatus of claim 11 wherein the periphery ridge base is discontinuous and includes separate periphery portions, wherein:
the plurality of periphery via holes is located in certain ones of the periphery portions; and
the metal layer fully covers an exposed bottom surface of each periphery portion, and fully covers exposed side surfaces of each periphery portion except outward side surfaces of each periphery portion.

14. The apparatus of claim 1 wherein:
the plurality of protrusions includes a plurality of ground pillar bases; and
the metal layer fully covers exposed surfaces of each of the plurality of ground pillar bases, and covers portions of the bottom surface of the substrate base that surround each of the plurality of ground pillar bases.

15. The apparatus of claim 14 wherein:
the at least one via hole includes a plurality of ground via holes;
each of the plurality of ground via holes is located at a center of a corresponding ground pillar base, and extends vertically through the corresponding ground pillar base and the substrate base; and
the metal layer fully covers inner surfaces of each of the plurality of ground via holes.

16. The apparatus of claim 15 wherein:
each of the plurality of ground pillar bases has a cylinder shape with a diameter between 10 μm and 150 μm, or has a cuboid shape with a bottom area between 10 μm×10 μm and 100 μm×100 μm; and
each of the plurality of ground via holes is a circular via hole with a diameter between 5 μm and 60 μm, or a rectangular via hole with a bottom size between 5 μm×5 μm and 50 μm×50 μm.

17. The apparatus of claim 14 wherein:
none of the plurality of ground pillar bases has any via hole; and
each of the plurality of ground pillar bases has a cylinder shape with a diameter between 10 μm and 150 μm, or has a cuboid shape with a bottom area between 10 μm×10 μm and 100 μm×100 μm.

18. The apparatus of claim 1 wherein:
the plurality of protrusions includes an inner ridge base that resides at an interior portion of the bottom surface of the substrate base, and the at least one via hole includes a plurality of inner via holes;
the plurality of inner via holes is scattered within the inner ridge base and each of the plurality of inner via holes extends vertically through the inner ridge base and the substrate base; and
the metal layer fully covers exposed surfaces of the inner ridge base and inner surfaces of each of the plurality of inner via holes to form an inner ridge structure, which is configured to provide radio frequency (RF) signal isolation between adjacent component portions located at opposite sides of the inner ridge structure.

19. The apparatus of claim 1 wherein:
the plurality of protrusions includes a mesa base, and the at least one via hole includes a plurality of mesa via holes;

the plurality of mesa via holes is scattered within the mesa base and each of the plurality of mesa via holes extends vertically through the mesa base and the substrate base; and the metal layer fully covers exposed surfaces of the mesa base and inner surfaces of each of the plurality of mesa via holes to form a mesa structure, which is electrically coupled to one of the plurality of component portions, and configured to provide integrated thermal management of the corresponding component portion.

20. The apparatus of claim 19 wherein a size of the mesa structure is not smaller than the corresponding component portion, such that the mesa structure fully covers the corresponding component portion.

21. The apparatus of claim 1 wherein the plurality of protrusions provides at least one shape of a group consisting of a cylinder, a cube, and a cuboid.

22. The apparatus of claim 1 wherein:

the plurality of protrusions includes a plurality of bias pillar bases and a plurality of ground pillar bases, the at least one via hole includes a plurality of bias via holes, and the bottom surface of the substrate base includes a plurality of isolation areas;

each of the plurality of bias via holes is located at a center of a corresponding bias pillar base, and extends vertically through the corresponding bias pillar base and the substrate base;

each of the plurality of isolation areas surrounds a corresponding bias pillar base; and the metal layer fully covers exposed surfaces of each of the plurality of bias pillar bases, fully covers inner surfaces of each of the plurality of bias via holes, fully covers exposed surfaces of each of the plurality of ground pillar bases, and fully covers exposed portions of the bottom surface of the substrate base except the plurality of isolation areas.

23. The apparatus of claim 22 wherein:

the at least one via hole further includes a plurality of ground via holes;

each of the plurality of ground via holes is located at a center of a corresponding ground pillar base, and extends vertically through the corresponding ground pillar base and the substrate base; and the metal layer fully covers inner surfaces of each of the plurality of ground via holes.

24. The apparatus of claim 22 wherein each of the plurality of bias pillar bases and each of the plurality of ground pillar bases have a same shape and a same size.

* * * * *